(12) United States Patent
Watanabe et al.

(10) Patent No.: US 12,174,113 B2
(45) Date of Patent: Dec. 24, 2024

(54) PHOTORESIST CHARACTERISTICS ANALYSIS METHOD AND CHARACTERISTICS ANALYSIS DEVICE

(71) Applicant: FEMTO Deployments Inc., Okayama (JP)

(72) Inventors: Akira Watanabe, Okayama (JP); Tadashi Okuno, Okayama (JP); Takeji Ueda, Okayama (JP)

(73) Assignee: FEMTO Deployments Inc., Okayama (JP)

( * ) Notice: Subject to any disclaimer, the term of this patent is extended or adjusted under 35 U.S.C. 154(b) by 0 days.

(21) Appl. No.: 17/768,302

(22) PCT Filed: Sep. 28, 2020

(86) PCT No.: PCT/JP2020/036615
§ 371 (c)(1),
(2) Date: Apr. 12, 2022

(87) PCT Pub. No.: WO2021/111713
PCT Pub. Date: Jun. 10, 2021

(65) Prior Publication Data
US 2024/0102927 A1 Mar. 28, 2024

(30) Foreign Application Priority Data

Dec. 4, 2019 (JP) ................................. 2019-219479

(51) Int. Cl.
*G01N 21/3586* (2014.01)
*G01N 21/95* (2006.01)
(Continued)

(52) U.S. Cl.
CPC ..... *G01N 21/3586* (2013.01); *G01N 21/9501* (2013.01); *G03F 7/40* (2013.01);
(Continued)

(58) Field of Classification Search
CPC ........... G01N 21/3586; G01N 21/9501; G01N 2021/8427
See application file for complete search history.

(56) References Cited

U.S. PATENT DOCUMENTS

2010/0235114 A1 9/2010 Levy et al.

OTHER PUBLICATIONS

Yiping Wang, "Optical properties of photoresist in the terahertz range", May 23, 2013 (Year: 2013).*

(Continued)

*Primary Examiner* — Maurice C Smith
(74) *Attorney, Agent, or Firm* — POLSINELLI PC

(57) ABSTRACT

A terahertz-wave signal input unit 11 configured to input a terahertz-wave signal from a spectroscopic apparatus 200 for detecting a terahertz wave acting on a photoresist, and a terahertz-wave signal analysis unit 12 configured to analyze a terahertz-wave signal input by the terahertz-wave signal input unit 11 to acquire characteristic information of the photoresist are included, and spectroscopic processing using a terahertz wave is performed on a photoresist to acquire characteristic information of the photoresist (a characteristic value or a correlation characteristic indicating a relationship between a plurality of elements including the characteristic value). Even though the characteristics of the photoresist change depending on the light, since the characteristic change is not caused by the terahertz wave, it is possible to acquire characteristic information of the photoresist without changing the characteristics of the photoresist, and to properly evaluate the characteristics of the photoresist from the characteristic information.

8 Claims, 11 Drawing Sheets

(51) Int. Cl.
    *G03F 7/40*     (2006.01)
    *H01L 21/66*     (2006.01)
    *G01N 21/84*     (2006.01)

(52) U.S. Cl.
    CPC ...... *H01L 22/10* (2013.01); *G01N 2021/8411* (2013.01); *G01N 2021/8427* (2013.01); *G01N 2201/126* (2013.01)

(56) References Cited

OTHER PUBLICATIONS

European Search Report issued on Nov. 14, 2023 for corresponding European Application No. 20 89 5647.
Naftaly, M. et al.: "Terahertz Time-Domain Spectroscopy for Material Characterization", Proceedings of the IEEE, IEEE. New York, US, vol. 95, No. 8, Aug. 8, 2007 (Aug. 8, 2007), pp. 1658-1665 XP011193359.
Sahin, Seckin et al.: "Dielectric Properties of Low-Loss Polymers for mmW and THz Applications", International Journal of Infrared and Millimeter Waves, Springer New York LLC, US, vol. 40, No. 5, Mar. 30, 2019 (Mar. 30, 2019), pp. 557-573 XP036770121.
Ghalichechian, Nima et al.: "Permittivity and Loss Characterization of SU-8 Films for mmW and Terahertz Applications", IEEE Antennas and Wireless Propagation Letters, vol. 14, Dec. 11, 2014 (Dec. 11, 2014), pp. 723-726 XP011574370.
Xueguang, Wang et al.: "The Analysis of Photoresist's Absorption Spectrum by THz-TDS", Photonics and Optoelectronics, 2009. SOPO 2009. Symposium ON, IEEE Express Conference Publishing, Piscataway, NJ, USA, Aug. 14, 2009 (Aug. 14, 2009), pp. 1-4 XP031524476.
The Japan Institute Metals and Materials, Introduction of terahertz measurement in semiconductor process: terahertz spectrum of thick film photoresist for RIE deep etching, Summary of the 2009 Fall (145th) Conference, [result].
Takahashi et al., The Japan Society Applied Physics, Sep. 15, 2009, 30p-P5-8, Terahertz Spectroscopy of Photoresist films on Semiconductor Surface.
Wang et al., "Optical properties of photoresist in the terahertz range", Superlattices and Microstructures, May 23, 2013, vol. 60, pp. 606-611, doi: 10.1016/j. spmi. 2013.05.018 "3. Experimental", "Results and discussion", Fig. 2-5.

* cited by examiner

Fig. 6
(a) 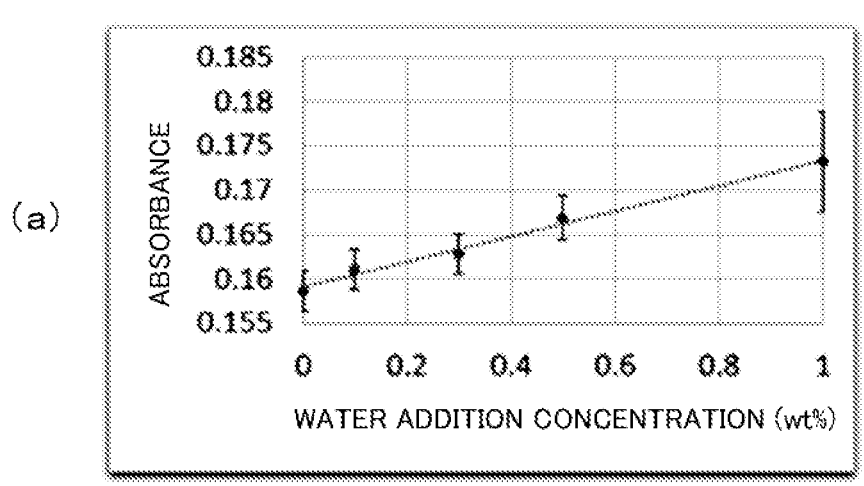
(b) 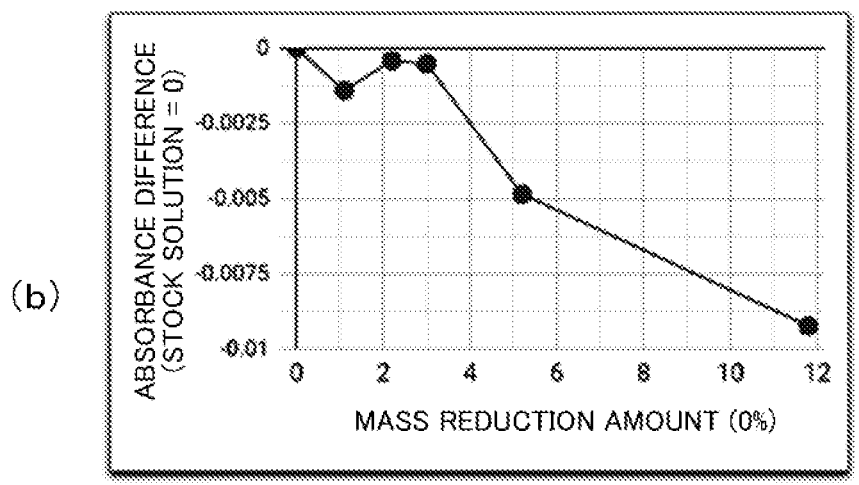

FREQUENCY (Hz)

FREQUENCY (Hz)

PHOTORESIST CHARACTERISTICS ANALYSIS METHOD AND CHARACTERISTICS ANALYSIS DEVICE

CROSS REFERENCE TO RELATED APPLICATIONS

This application is a National Phase filing under 35 U.S.C. § 371 of PCT/JP2020/036615 filed on Sep. 28, 2020; which application in turn claims priority to Application No. 2019-219479 filed in Japan on Dec. 4, 2019. The entire contents of each application are hereby incorporated by reference.

TECHNICAL FIELD

The present invention relates to a photoresist characteristic analysis method and a characteristic analysis apparatus.

BACKGROUND ART

A photoresist is applied to a surface of a substance and is used for the purpose of protecting the surface of the substance from a subsequent treatment such as etching. The photoresist is manufactured as a liquid and is used in a manufacturing process of a semiconductor device, MEMS, a liquid crystal monitor, etc. to form a protective pattern on a substrate through coating, prebaking, exposure, development, post-baking, etc. After performing etching or a film formation process on a surface of the substrate exposed from the protective pattern, the photoresist is peeled off from the substrate.

Through processing of a plurality of processes described above, the photoresist undergoes various state changes from a liquid state in which a polymer is dispersed to a state of being applied onto the substrate, a state where a dissolvent evaporates due to baking, a state where a photochemical reaction occurs due to exposure, a state where a thermal cross-linking reaction occurs due to post-baking, etc.

Note that, an apparatus for inspecting the bonding strength of a wafer using a terahertz wave has been known (for example, see Patent Document 1). The inspection apparatus described in Patent Document 1 includes a terahertz wave detector that detects a terahertz wave penetrating or reflected by a bonded wafer, and a calculation unit that calculates terahertz wave characteristics of the bonded wafer from the terahertz wave detected by the terahertz wave detector. The calculation unit calculates the bonding strength corresponding to the terahertz wave characteristics of the bonded wafer to be inspected from a relationship between terahertz wave characteristics of a reference sample and the bonding strength obtained in advance.

Patent Document 1: JP-A-2013-4578

SUMMARY OF THE INVENTION

Technical Problem

Conventionally, it has been considered that the quality of photoresists is stable. However, in reality, the quality may vary. For this reason, in a photoresist that undergoes various state changes through each processing process as described above, there is a need to observe the characteristics for each of the various states. However, when a measuring means such as heat or light (visible light, ultraviolet rays, infrared rays) acts on the photoresist, there are problems that a molecular structure, thickness, chemical resistance, etc. of the photoresist are affected by the effect, and it is difficult to measure the characteristics of the photoresist without change.

For example, when a trouble occurs in a manufacturing process of a product using a photoresist, it is not easy to identify a stage at which the photoresist has a defect. That is, since there is no method for consistently measuring the characteristics of the photoresist, a state of which changes over a plurality of processes, there are problems that it is impossible to determine the abnormality of the photoresist until a protective pattern is created on a substrate, and it is impossible to determine a stage at which the photoresist has a defect in a plurality of processes.

The invention has been made to solve such a problem, and an object of the invention is to be able to appropriately evaluate characteristics of a photoresist in a process without changing the characteristics of the photoresist by measurement.

Solution to Problem

In order to solve the above-mentioned problems, in the invention, by performing spectroscopic processing using a terahertz wave on a photoresist, characteristic information (a characteristic value or a correlation characteristic indicating a relationship between a plurality of elements including the characteristic value) of the photoresist is acquired.

Advantageous Effects of the Invention

A photoresist changes in characteristics when exposed to visible light, ultraviolet rays, and infrared rays. However, a characteristic change of the photoresist is not caused by a terahertz wave. In the invention, by utilizing this property to spectroscopically measure the photoresist using a terahertz wave, it is possible to acquire characteristic information of the photoresist in a process without changing the characteristics of the photoresist by action of a measuring means, and to appropriately evaluate the characteristics of the photoresist from the characteristic information.

BRIEF DESCRIPTION OF THE DRAWINGS

FIG. 6 is a diagram illustrating an experimental result of a first example.

MODE FOR CARRYING OUT THE INVENTION

Figure 1:
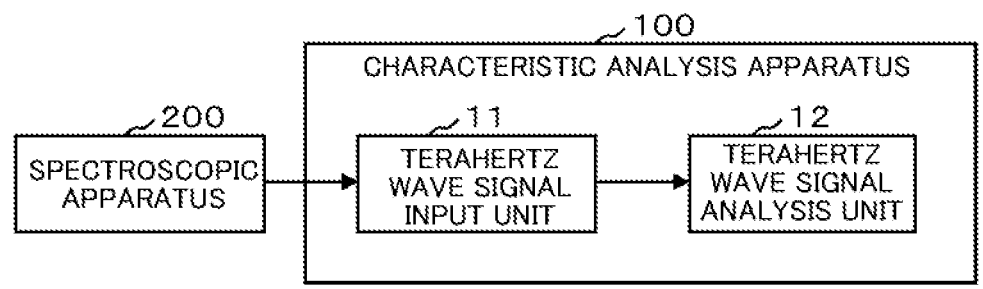
FIG. 1 is a block diagram illustrating a functional configuration example of a photoresist characteristic analysis apparatus according to an embodiment.

Hereinafter, an embodiment of the invention will be described with reference to the drawings. FIG. 1 is a block diagram illustrating a functional configuration example of a photoresist characteristic analysis apparatus (hereinafter simply referred to as characteristic analysis apparatus) according to the present embodiment. As illustrated in FIG. 1, the characteristic analysis apparatus 100 of the present embodiment includes a terahertz-wave signal input unit 11 and a terahertz-wave signal analysis unit 12 as functional configurations.

The characteristic analysis apparatus 100 of the present embodiment is connected to a spectroscopic apparatus 200 that detects a terahertz wave acting on a photoresist. Examples of a known measurement method using a terahertz wave include a time domain spectroscopy method using a pulse and a photoconductive antenna, a differential frequency generation method, a single wavelength generation method using a cascade laser, etc. Any technology may be applied to the spectroscopic apparatus 200.

In the present embodiment, the spectroscopic apparatus 200 and the characteristic analysis apparatus 100 are used to perform spectroscopic processing using a terahertz wave on the photoresist, thereby acquiring characteristic information of the photoresist. Here, an example in which the characteristic analysis apparatus 100 of the present embodiment is configured separately from the spectroscopic apparatus 200 is given. However, the invention is not limited thereto. For example, the characteristic analysis apparatus 100 of the present embodiment may be configured to include the spectroscopic apparatus 200.

The terahertz-wave signal input unit 11 of the characteristic analysis apparatus 100 inputs a terahertz-wave signal detected by the spectroscopic apparatus 200.

The terahertz-wave signal analysis unit 12 acquires the characteristic information of the photoresist by analyzing the terahertz-wave signal input from the spectroscopic apparatus 200 by the terahertz-wave signal input unit 11. In the present embodiment, the terahertz-wave signal analysis unit 12 acquires a characteristic value of the photoresist or a correlation characteristic indicating a relationship between a plurality of elements including the characteristic value as the characteristic information of the photoresist.

As the correlation characteristic, the terahertz-wave signal analysis unit 12 acquires at least one of a frequency domain correlation characteristic (frequency spectrum) indicating a relationship between a frequency and the characteristic value of the photoresist, a time domain correlation characteristic, which indicates a relationship between a processing time for the photoresist and the characteristic value of the photoresist, and an inter-characteristic value correlation characteristic indicating a relationship between a first characteristic value and a second characteristic value of the photoresist.

The terahertz-wave signal analysis unit 12 may perform the following processing when acquiring the characteristic value of the photoresist, or when acquiring the time domain correlation characteristic or the inter-characteristic value correlation characteristic. That is, first, a frequency spectrum indicating a relationship between the frequency and the characteristic value is acquired (first step), and a single frequency is specified according to a predetermined criterion based on the acquired frequency spectrum (second step). Then, the characteristic value is acquired at the specified frequency, or the correlation characteristic is acquired using the characteristic value detected at the specified frequency (third step).

The predetermined criterion is, for example, a criterion as to whether or not characteristic information favorably expresses the characteristics of the photoresist when the characteristic information is acquired by extracting a specific frequency. To favorably express the characteristics of the photoresist means that the correlation characteristic acquired in the third step may be accurately fit by a predetermined function, that a singular characteristic value may be seen in the correlation characteristic, or that there is a characteristic tendency in the characteristic value or the correlation characteristic. In addition, as will be described later, based on accumulated data, it is possible to analyze a significant relationship between an abnormality of the photoresist and the characteristic information of the photoresist (characteristic value or correlation characteristic), and to specify a frequency at which a characteristic caused by the abnormality is likely to appear in the characteristic information.

Figure 2:
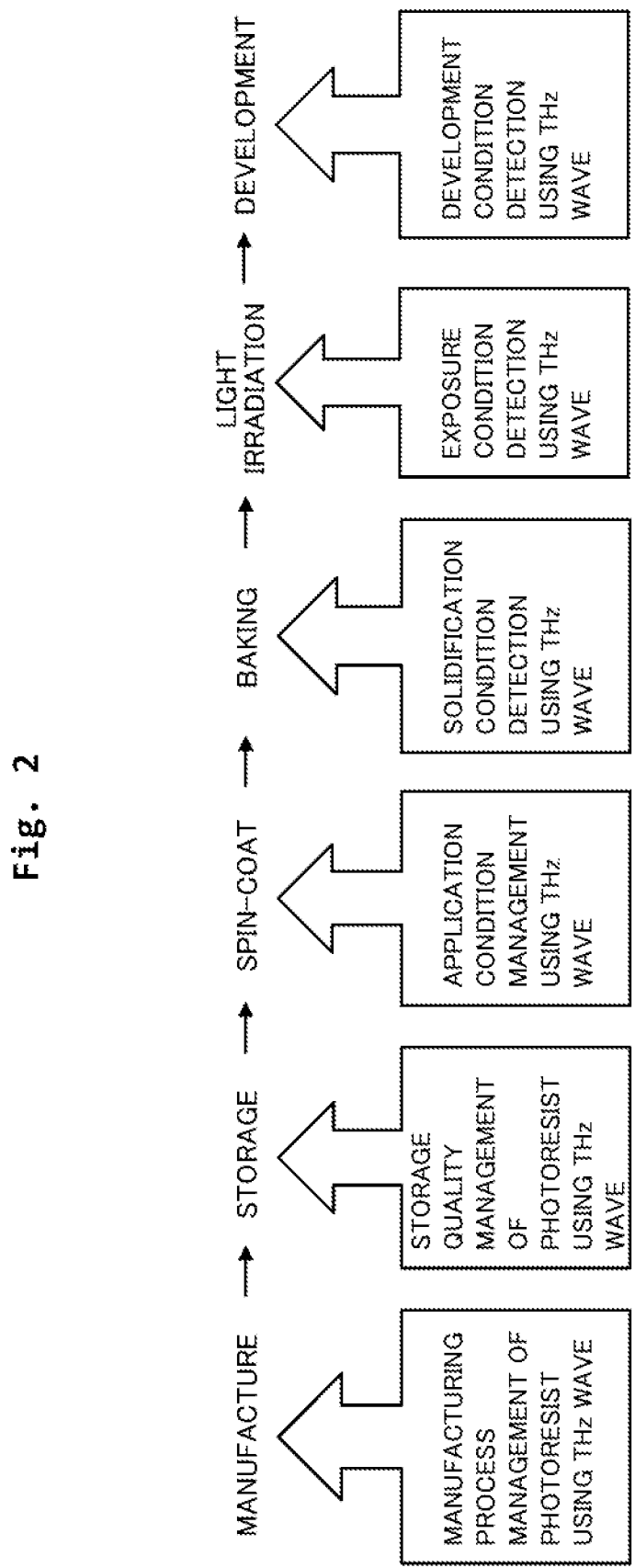
FIG. 2 is a diagram illustrating an example of a process of spectroscopically measuring characteristics of a photoresist using a terahertz wave.

Further, in the present embodiment, as illustrated in FIG. 2, for example, characteristic information is acquired by performing spectroscopic measurement using a terahertz wave on a photoresist during execution or after execution of processing of at least one process among a plurality of processes from a process of manufacturing a photoresist used for manufacturing a semiconductor device to a process of developing a wafer to which the photoresist is applied. Note that, in FIG. 2, baking (also referred to as bake) is performed before light irradiation. However, thermal cross-linking may be performed by post-baking after development.

The photoresist changes in characteristics when exposed to visible light, ultraviolet rays, and infrared rays, and a characteristic change of the photoresist is not caused by a terahertz wave. For this reason, it is possible to acquire the photoresist characteristic information in each process in a plurality of processes from the manufacturing step to the developing step of the photoresist without changing the photoresist characteristic by terahertz wave spectroscopic measurement. In this instance, it is possible to consistently measure the characteristics of the photoresist in each of a liquid-dissolved state, a solid state, and a chemical reaction progress state of a polymer using the same measurement technology.

For each process, the terahertz-wave signal analysis unit 12 acquires characteristic information related to at least one of the characteristic value of the photoresist, the frequency domain correlation characteristic, the time domain correlation characteristic, and the inter-characteristic value correlation characteristic. By obtaining any of the characteristic information, it is possible to evaluate the characteristics of the photoresist from the characteristic information. Here, the characteristics of the photoresist are characteristics caused by a dispersed state of a polymer, partial crystallization of a polymer in a process of removing a dissolvent, structuring by residual moisture, cross-linking by a photochemical reaction or a thermal reaction of a polymer, etc., and refers to any characteristics that may be detected by terahertz wave spectroscopic measurement.

Further, evaluation of the characteristics of the photoresist includes, for example, monitoring a change in the characteristics of the photoresist and determining whether or not a predetermined state is obtained. The evaluation may include determining whether or not any abnormality has occurred in the characteristics of the photoresist. Since the photoresist is a material having a complicated composition and partial structure, it may not be possible to deterministically identify a molecular state or a change thereof from the detected characteristic information. However, it is possible to monitor the characteristics of the photoresist and control processing of each process so that abnormalities do not occur, or to detect an abnormality of the photoresist at an early stage in each process. In addition, it is possible to include comprehending a yield from the characteristics of the photoresist as one aspect of the evaluation.

The photoresist manufactured in the manufacturing process and the photoresist stored in the storage process illustrated in FIG. 2 are in a liquid state containing a polymer or a photosensitizer dispersed in a dissolvent as a main component. Evaluation indexes required at this stage are that the polymer or photosensitizer is solvated in the dissolvent and dispersed uniformly and stably, that impurities such as water are not mixed in, and that the dissolvent is not evaporated. In the present embodiment, in order to enable such evaluation, characteristic information using a terahertz wave is acquired for a photoresist in a liquid state in a process before application to a wafer (manufacturing process or storage process).

Photon energy of a terahertz wave is about 4 millielectone volts, and corresponds to energy of the intermolecular interaction, and thus a spectrum that reflects a dispersed state of a polymer in a dissolvent involved in the intermolecular interaction is produced. Therefore, the characteristic information (specific content will be described later) acquired by the terahertz-wave signal analysis unit 12 may be utilized for stability evaluation for each lot during manufacture. In addition, when there is agglutination or partial crystallization of the polymer during storage or transportation, or structure formation containing water, the agglutination or partial crystallization, or the structure formation may be detected by the characteristic information of the photoresist, which is effective in pre-shipment inspection and acceptance inspection.

Further, the terahertz-wave signal analysis unit 12 may acquire characteristic information using the terahertz wave also for a photoresist in a state of being applied in a form of a thin film onto a surface of the wafer in an application step (spin coating). Further, the terahertz-wave signal analysis unit 12 may acquire characteristic information using the terahertz wave also for a photoresist in a state of undergoing processing of a baking process (baking) after the application process. In these processes, the dissolvent is removed from the applied photoresist, which results in solidification. Vibration of a solid is one of targets that may be detected by the terahertz wave, and may be identified as a defect when there is an abnormal change in partial crystallization or cross-linked structure thereof (details will be described later).

Further, the terahertz-wave signal analysis unit 12 may acquire characteristic information using the terahertz wave also for a photoresist in a state of undergoing exposure processing in an exposure process (light irradiation) after the baking process. Furthermore, the terahertz-wave signal analysis unit 12 may acquire characteristic information using the terahertz wave also for a photoresist in a state of undergoing development processing in a development process after the exposure process. These processes are processes in which a chemical structure of the photoresist and a dissolution characteristic in a developing solution are significantly changed by the photochemical reaction, and are the steps for determining success or failure of protective pattern formation.

Figure 3:
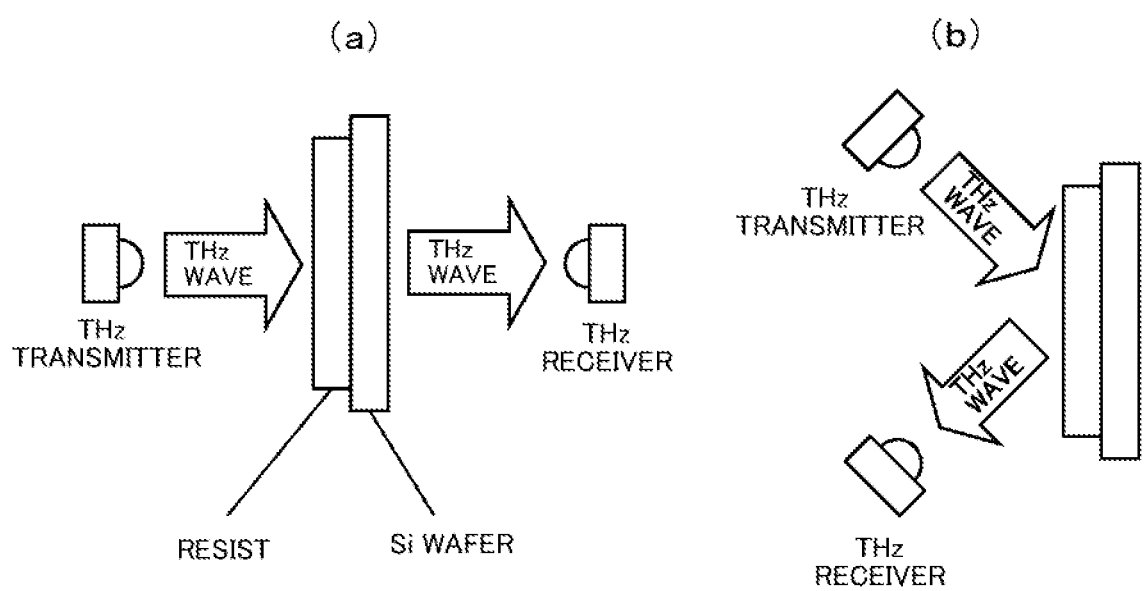
FIG. 3 is a diagram illustrating a state in which terahertz wave spectroscopic measurement of a photoresist while being applied to a silicon wafer is performed.

Since silicon, which is used as a material of the wafer forming the photoresist, has high terahertz wave permeability, it is possible to perform terahertz wave spectroscopic measurement of the photoresist in a state of being applied to the silicon wafer, and constant and non-destructive observation is possible in the manufacturing process. For example, as illustrated in FIG. 3(a), the characteristics of the photoresist applied onto the silicon wafer may be observed in a transmission spectrum by utilizing a basic property that the silicon wafer has high permeability with respect to the terahertz wave. In this case, the spectroscopic apparatus 200 transmits the terahertz wave through the photoresist applied to the silicon wafer, and detects the terahertz wave penetrating the photoresist and the silicon wafer.

Meanwhile, some silicon wafers are produced by adding various materials to silicon, and some silicon wafers are difficult to transmit the terahertz wave. In this case, as illustrated in FIG. 3(b), similar characteristics to those of the transmission spectrum may be obtained by observing a reflected wave in the photoresist. In this case, the spectroscopic apparatus 200 causes the terahertz wave to be reflected on the photoresist applied to the silicon wafer, and detects the terahertz wave reflected by the photoresist.

Here, by scanning the silicon wafer to which the photoresist is applied, a pair of a transmitter and a receiver of the terahertz wave, or both thereof to perform spectroscopic processing so that a positional relationship between the silicon wafer and the pair of the transmitter and the receiver relatively changes, it is possible to acquire characteristic information at each position of the photoresist on the silicon wafer.

Figure 4:
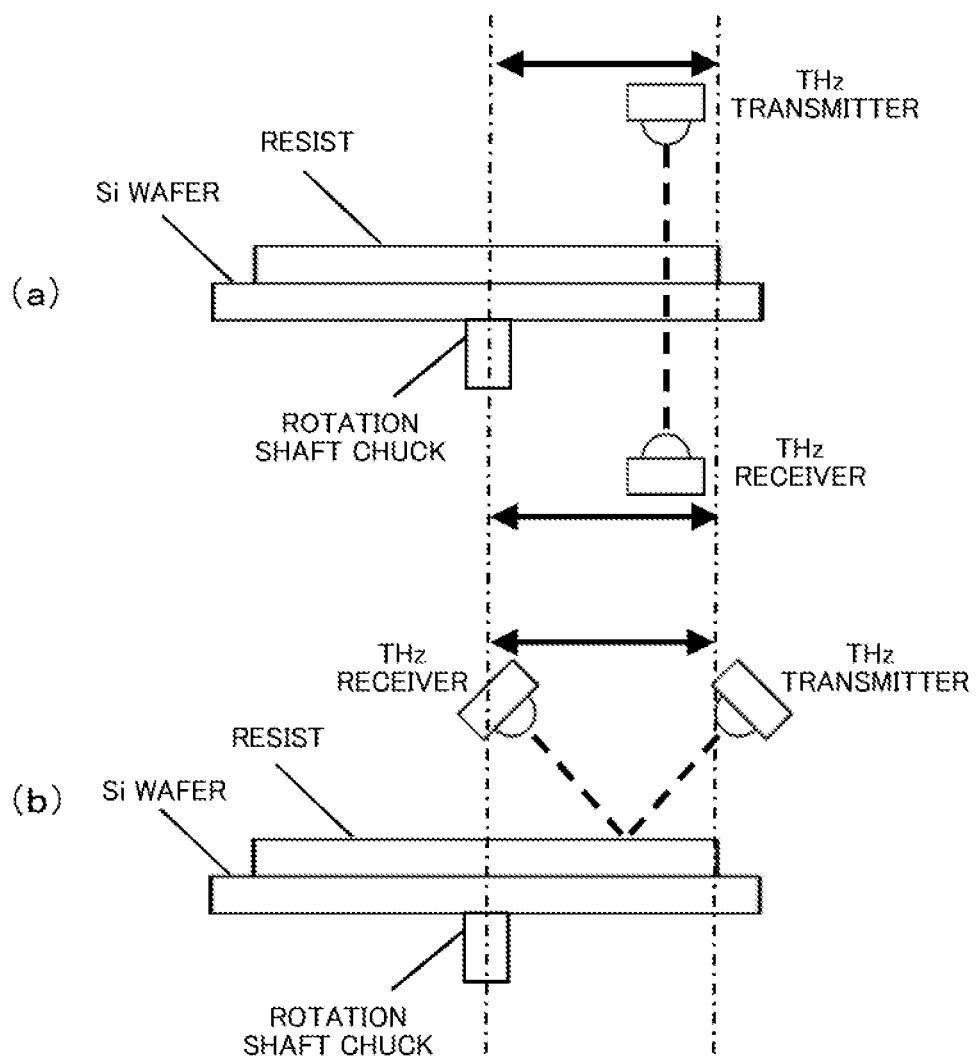
FIG. 4 is a diagram illustrating a state in which terahertz wave spectroscopic measurement is performed by scanning each position of the photoresist.
Figure 5:
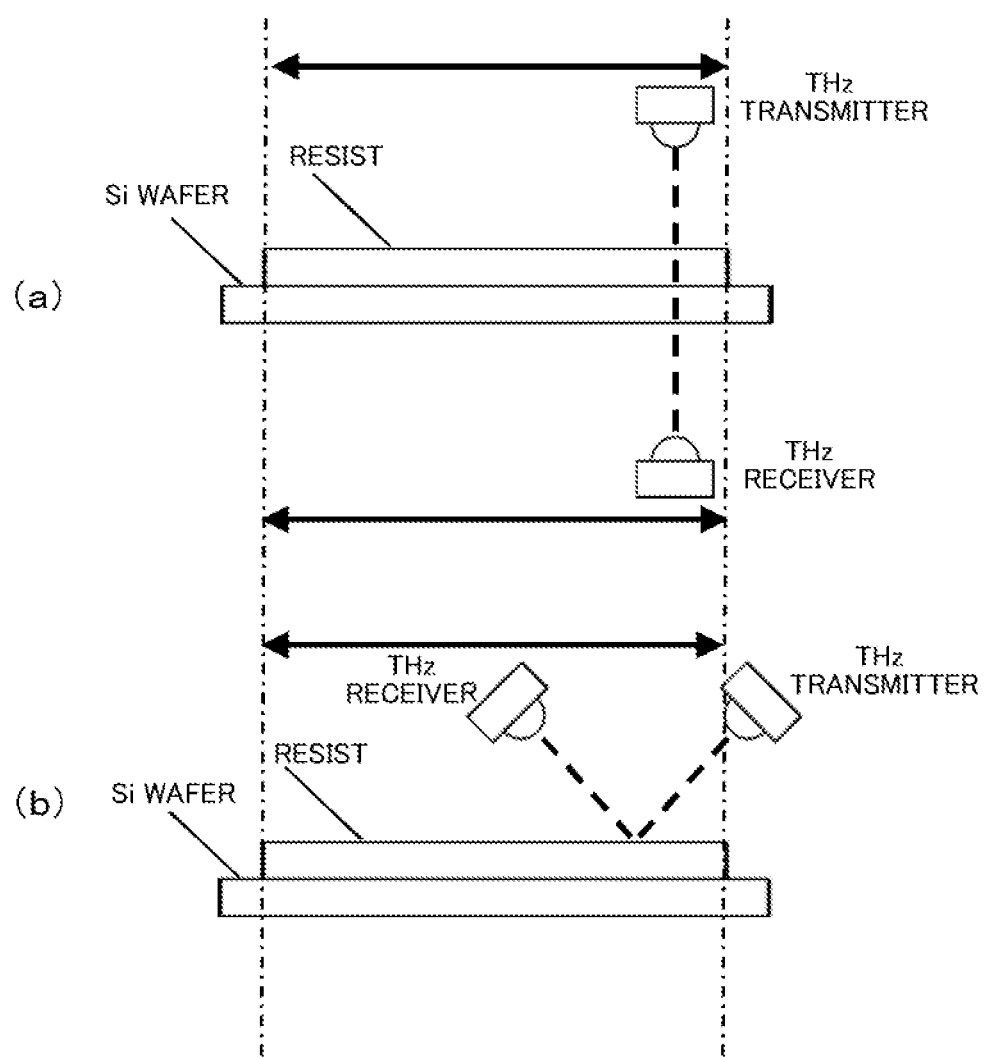
FIG. 5 is a diagram illustrating a state in which terahertz wave spectroscopic measurement is performed by scanning each position of the photoresist.

For example, as illustrated in FIG. 4, by moving the pair of the transmitter and the receiver in a radial direction while rotating a disc-shaped silicon wafer (to which the photoresist is applied) set on a rotation shaft chuck, it is possible to scan the entire surface of the photoresist to perform spectroscopic processing. In addition, spectroscopic processing may be performed by scanning a specific peripheral surface of the photoresist while rotating the silicon wafer in a state where the pair of the transmitter and the receiver is fixed. In addition, as illustrated in FIG. 5, the entire surface of the photoresist may be scanned to perform spectroscopic processing by moving the pair of the transmitter and the receiver in a matrix in a state where the silicon wafer is fixed.

A specific example of terahertz wave spectroscopic measurement of the characteristic information of the photoresist will be described below.

First Example

FIG. 6 is a diagram illustrating an experimental result of a first example in which terahertz wave spectroscopic measurement is performed on a photoresist in a liquid state before being applied to the wafer (photoresist during execution or after execution of processing of the manufacturing process or the storage process). Here, in order to accelerate deterioration or defect of the photoresist, an experiment in which water is added or heating is performed was conducted.

(1) Experiment in which Water is Added

FIG. 6(a) illustrates a change in the absorbance of the terahertz wave when various amounts of water are added to the photoresist, and is an inter-characteristic value correlation characteristic in which the first characteristic value is the absorbance, and the second characteristic value is the water addition concentration. This inter-characteristic value correlation characteristic is generated by extracting a specific wavelength (frequency) from the frequency spectrum through the processing of the first step to the third step described above. Specifically, a plurality of frequency spectra is acquired by terahertz wave spectroscopic measurement of a plurality of types of photoresists generated by changing the amount of water added, and a frequency at which the inter-characteristic value correlation characteristic is linear as illustrated in FIG. 6(a) is specified.

As illustrated in FIG. 6(a), the absorbance is less than 0.16 when water, which causes deterioration or defect of the photoresist, is not added, and the absorbance increases as the water addition concentration increases. Thus, it can be seen that there is a significant correlation between the absorbance of the photoresist and the concentration of water added. In this way, when the water content in the photoresist increases for some reason, the increase in the amount of water added may be confirmed from the characteristics (absorbance of a specific frequency) of the photoresist at that time in a non-contact and non-destructive manner. Further, by maintaining the value of the correlation characteristic illustrated in FIG. 6(a), it is also possible to estimate the extent to which the amount of water added is increasing from the absorbance at a specific frequency. In addition, by determining whether or not the absorbance at a specific frequency exceeds a value of about 0.163 in consideration of the standard deviation, it is possible to determine whether or not there is a possibility that a defect due to water addition has occurred in the photoresist.

(2) Experiment in which Solvent is Removed

In general, the photoresist is stored by being mixed with a solvent (dissolvent) in a solution state. When this solvent evaporates and is removed, the mass of the photoresist changes. FIG. 6(b) is an inter-characteristic value correlation characteristic indicating a correlation between the mass reduction amount of the photoresist and an absorbance difference of the terahertz wave. This inter-characteristic value correlation characteristic is generated by extracting a characteristic frequency (frequency at which the tendency of correlation illustrated in FIG. 6(b) is seen) from a wideband frequency spectrum through the processing of the first step to the third step described above. The absorbance difference refers to a difference in absorbance at a specific frequency obtained when terahertz wave spectroscopic measurement is performed on the photoresist with a time difference.

As illustrated in FIG. 6(b), when the evaporation amount of the solvent is small and the mass reduction amount of the photoresist is about 3% or less, the absorbance difference is close to 0 (less than 0.0025). On the other hand, when the mass reduction amount of the photoresist exceeds 3%, the absorbance difference rapidly increases. In this way, when the solvent is reduced for some reason, the fact that the solvent is reduced may be confirmed in a non-contact and non-destructive manner from the characteristics of the photoresist at that time (the absorbance difference with respect to the absorbance at a specific frequency measured for the photoresist in which the solvent has not vaporized). Further, by maintaining the value of the correlation characteristic illustrated in FIG. 6(b), it is possible to estimate the amount of evaporation of the solvent from the absorbance difference at the specific frequency. Further, by determining whether or not the absorbance difference at the specific frequency exceeds a value of, for example, about 0.0025, it is possible to determine whether or not there is a possibility that a defect due to solvent evaporation has occurred in the photoresist.

As described above, as illustrated in the example of FIGS. 6(a) and 6(b), performing terahertz wave spectroscopic measurement on the photoresist in the liquid state is effective as pre-shipment inspection and acceptance inspection.

Note that, the baking process is a process of intentionally evaporating the dissolvent of the photoresist. Therefore, by maintaining the value of the correlation characteristic illustrated in FIG. 6(b), performing terahertz wave spectroscopic measurement in real time during execution of the baking process, and acquiring the absorbance difference at the specific frequency, it is possible to estimate the amount of evaporation of the dissolvent, and to estimate the degree of progress of the baking process. In addition, it is possible to perform a control operation to monitor the absorbance difference at regular time intervals during the execution of the baking process and suspend the baking process when the absorbance difference indicating the preferable evaporation amount of the dissolvent is obtained.

Second Example

Figure 7:
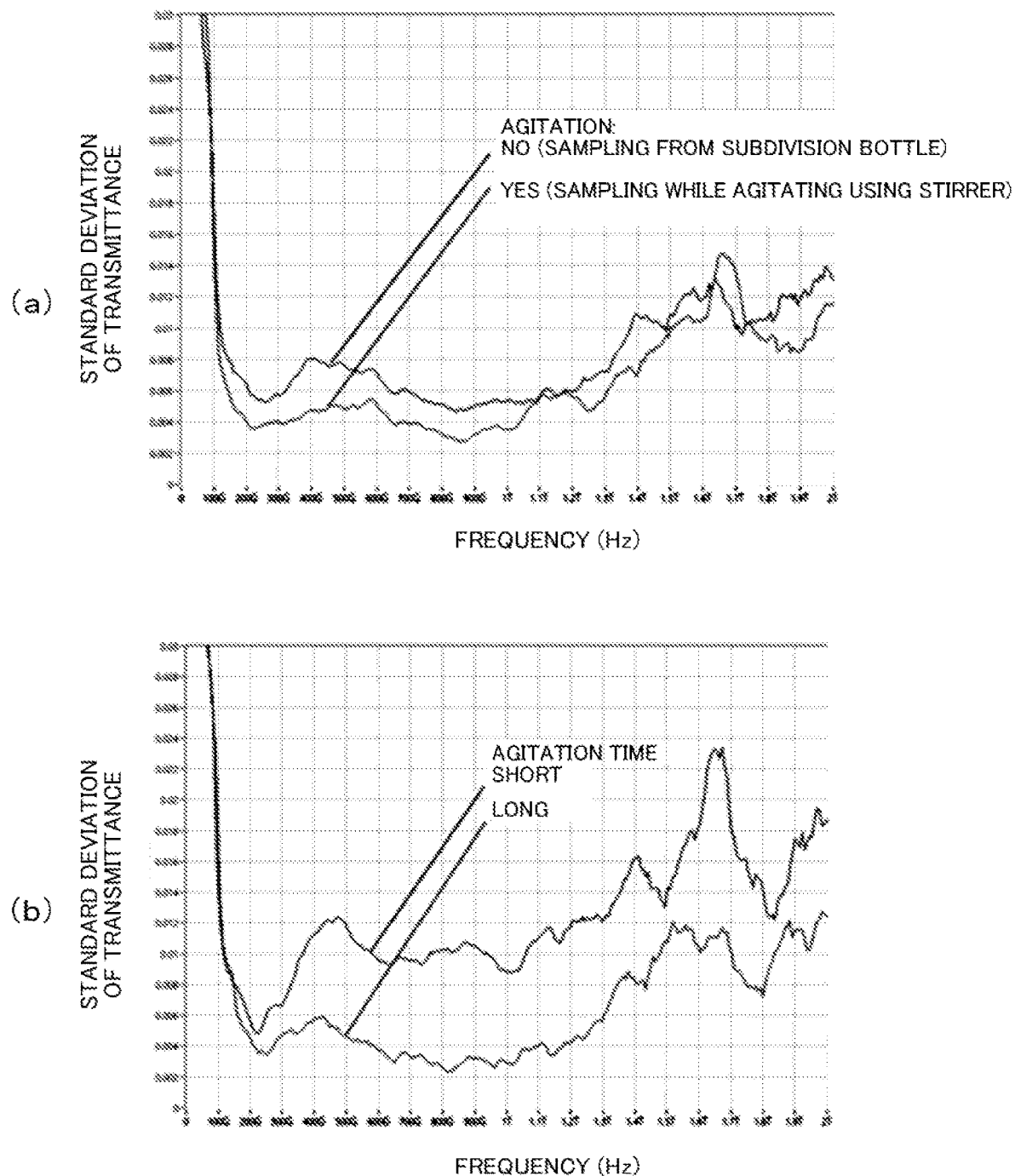
FIG. 7 is a diagram illustrating an experimental result of a second example.

FIG. 7 is a frequency spectrum diagram illustrating an experimental result of a second example in which terahertz wave spectroscopic measurement is performed on the photoresist in the liquid state before being applied to the wafer. In FIG. 7, the horizontal axis indicates the frequency and the vertical axis indicates the standard deviation of the transmittance. Here, when the photoresist is collected from a container a plurality of times, a deviation occurring with respect to the transmittance is evaluated by the standard deviation of the transmittance. FIG. 7(a) illustrates that, when the photoresist stored in the liquid state is collected from the container, there is a difference depending on whether or not the photoresist is agitated.

As illustrated in FIG. 7(a), the standard deviation of the transmittance is larger when the photoresist is not agitated than that when the photoresist is agitated. Generally, it is known that the variation in transmittance may be suppressed by agitation, which means that, when agitation is not performed, the density of the photoresist or the distribution of the polymer structure is biased in the container, and the polymer or the photosensitizer is not uniformly and stably dispersed in the dissolvent. FIG. 7(a) may be considered as illustration thereof.

Meanwhile, FIG. 7(b) illustrates the standard deviation of the transmittance when the length of the agitation time is used as a parameter. FIG. 7(b) illustrates that, as the agitation time increases, the standard deviation of the transmittance decreases, and the photoresist is more homogenized. It can be said that FIG. 7(b) illustrates that, when the photoresist is not agitated in the container for a long time, the density of the photoresist or the distribution of the polymer structure tends to be biased.

From the above description, by continuously or intermittently performing terahertz wave spectroscopic measurement on the photoresist in the liquid state to acquire the frequency spectrum, it is possible to evaluate non-uniformity of the polymer, etc. in the photoresist from the magnitude of the standard deviation of the transmittance.

Third Example

Figure 8:
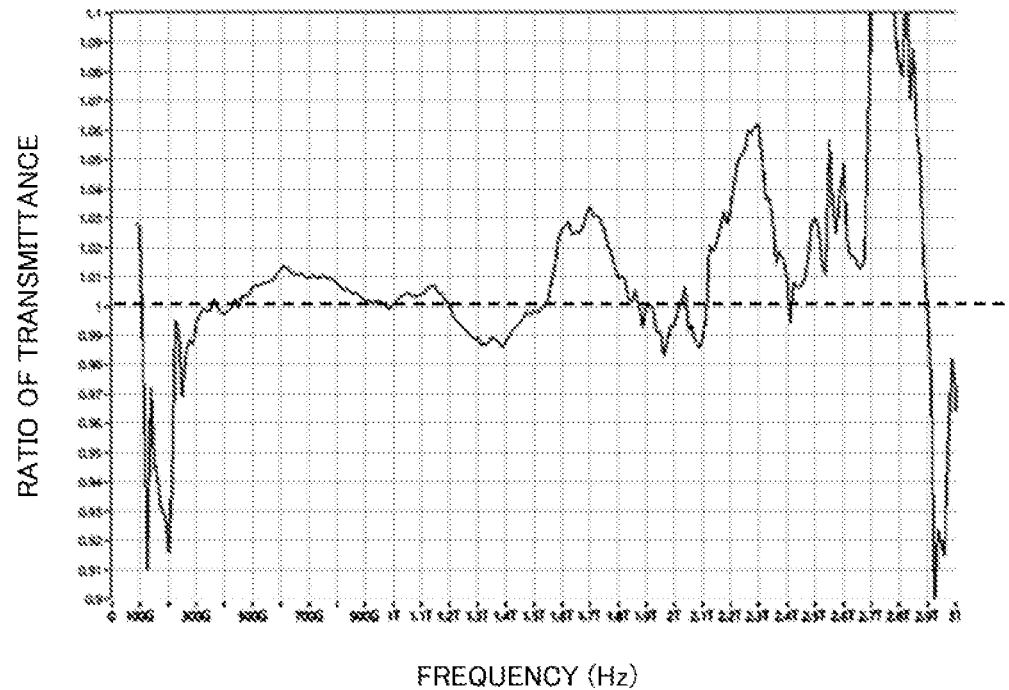
FIG. 8 is a diagram illustrating an experimental result of a third example.

FIG. 8 is a frequency spectrum diagram illustrating an experimental result of a third example in which terahertz wave spectroscopic measurement is performed on the photoresist in the liquid state before being applied to the wafer. FIG. 8 illustrates a ratio of transmittance when the photoresist is collected from the container without agitation and the photoresist is collected from the top and bottom of the container. In FIG. 8, the horizontal axis indicates the frequency and the vertical axis indicates the ratio of the transmittance.

When the photoresist in the container is completely homogenized, a frequency spectrum (frequency domain correlation characteristic representing the transmittance for each frequency) of the photoresist collected from the top of the container and a frequency spectrum (the above description is similarly applied) of the photoresist collected from the bottom of the container are almost the same, and a frequency spectrum having the ratio of the transmittance as a characteristic value has a characteristic in which the transmittance is almost flat at a value of 1 over the entire frequency range. On the other hand, the frequency spectrum illustrated in FIG. 8 illustrates that the terahertz wave characteristic is different between the photoresist collected from the top and the photoresist collected from the bottom in the container, and means that the photoresist in the container is not homogenized as a whole.

Therefore, by performing terahertz wave spectroscopic measurement on photoresists collected from different locations in the container, and acquiring a frequency spectrum having the ratio of transmittance as a characteristic value, it is possible to evaluate the non-uniformity of the photoresist from the frequency spectrum.

Fourth Example

Figure 9:
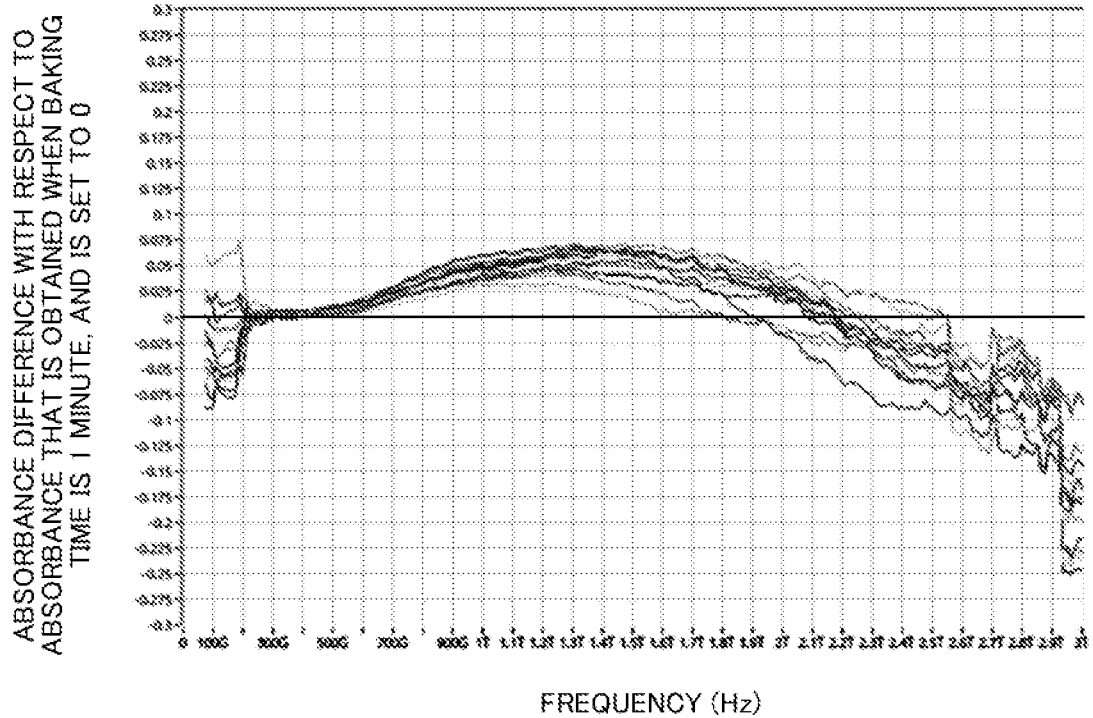
FIG. 9 is a diagram illustrating an experimental result of a fourth example.

FIG. 9 is a diagram of a frequency spectrum indicating an experimental result of a fourth example in which terahertz wave spectroscopic measurement is performed on the photoresist in a state where processing of the baking process (baking) after the application process is performed. As described above, since silicon has high transmittance of the terahertz wave, it is possible to perform a transmissive measurement of the terahertz wave with the photoresist applied to the silicon wafer as illustrated in FIG. 3(a).

Here, after the photoresist was applied to the silicon wafer, baking was performed on a hot plate at 80° C. for 15 minutes. FIG. 9 illustrates a spectrum of the absorbance difference of the terahertz wave depending on the baking time. Here, the absorbance difference when the baking time is changed is taken on the vertical axis with reference to the absorbance when the baking time is 1 minute. The horizontal axis indicates the frequency. The baking time, which is a parameter, is 1 to 15 minutes, and frequency spectrum of each thereof is illustrated. Overall, it can be seen that the frequency spectrum of the absorbance difference gradually changes as the baking time changes.

It is considered that the change in the frequency spectrum depending on the baking time illustrated in FIG. 9 is caused by a degree of solvent removal due to the progress of baking, a change in the cross-linked state of the polymer, and a change in the overall thickness of the photoresist. In this way, by performing terahertz wave spectroscopic measurement during or after execution of baking to acquire the frequency spectrum illustrated in FIG. 9, it is possible to evaluate changes in the state of the photoresist such as the degree of solvent removal, the cross-linked state, and the thickness with the photoresist applied onto the silicon wafer.

Figure 10:
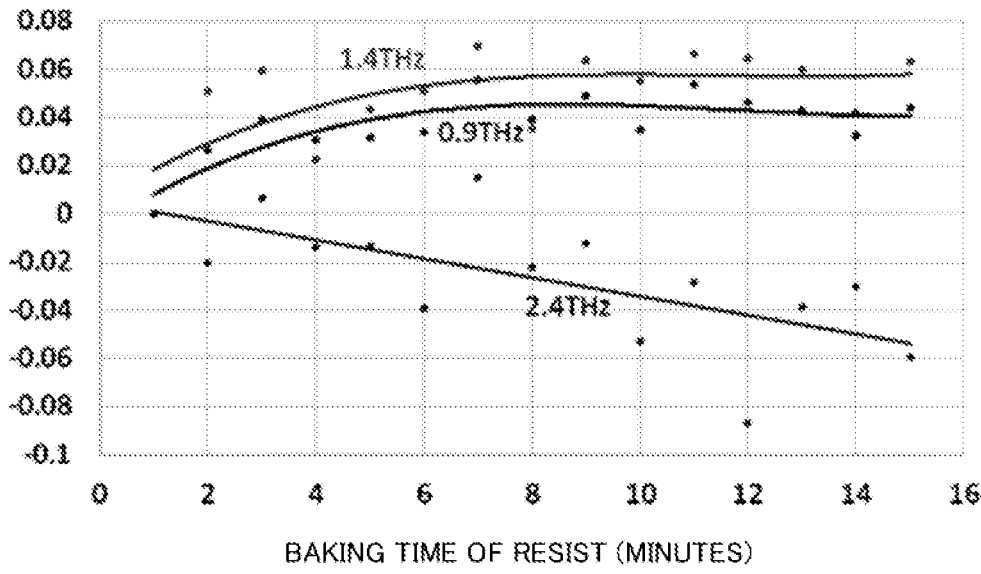
FIG. 10 is a diagram illustrating an experimental result of the fourth example.

FIG. 10 is the time domain correlation characteristic acquired by performing processing of the first step to the third step described above, and illustrates a baking time dependence of the absorbance difference at a specific frequency extracted based on the frequency spectrum of FIG. 9. As an example, FIG. 10 illustrates the changes in baking time of the absorbance difference at 0.9 THz, 1.4 THz, and 2.4 THz. As can be seen from FIG. 10, at 0.9 THz and 1.4 THz, the absorbance difference is saturated with a baking time of about 6 minutes. On the other hand, at 2.4 THz, the absorbance difference decreases almost monotonically as the baking time increases.

In this way, for example, by acquiring the absorbance difference at 2.4 THz at regular time intervals during the execution of the baking process, it is possible to estimate a degree of progress of the baking process. In addition, it is possible to perform a control operation to monitor the absorbance difference at regular time intervals during execution of the baking process and suspend the baking process when a preferable absorbance difference is obtained.

Fifth Example

Figure 11:
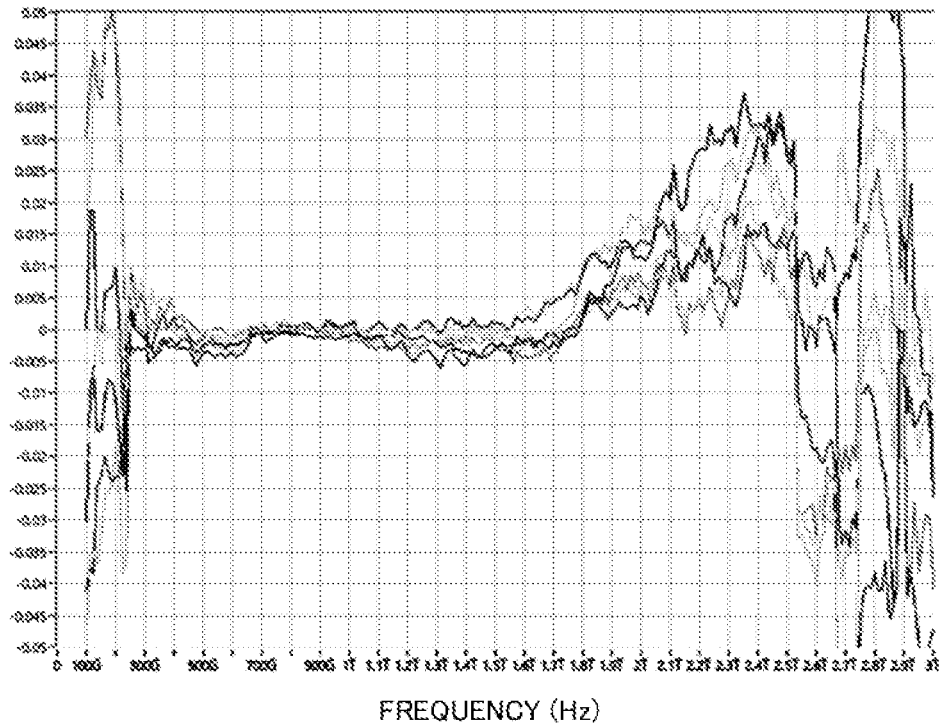
FIG. 11 is a diagram illustrating an experimental result of a fifth example.

FIG. 11 is a diagram of a frequency spectrum indicating an experimental result of a fifth example in which terahertz wave spectroscopic measurement is performed on the photoresist in a state where processing of the exposure process (light irradiation) after the baking process is performed. Here, the diagram illustrates a spectral change when the photoresist is further irradiated with UV after baking for 15 minutes on the hot plate at 80° C. as described above.

In FIG. 11, the vertical axis indicates a difference between the absorbance when the irradiation time is 0 seconds and each value of the absorbance when the irradiation times are 2 seconds, 4 seconds, 6 seconds, 8 seconds, 10 seconds, 70 seconds, and 130 seconds. The horizontal axis indicates the frequency. As illustrated in FIG. 11, a systematic change in the frequency spectrum may be seen due to the difference in irradiation time.

Figure 12:
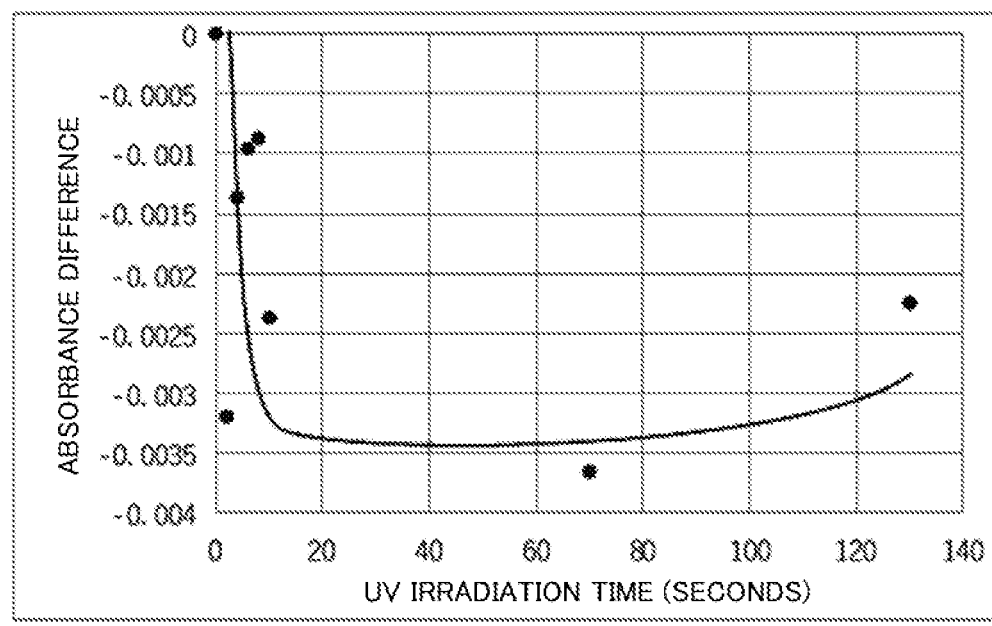
FIG. 12 is a diagram illustrating an experimental result of the fifth example.

FIG. 12 is a time domain correlation characteristic indicating the irradiation time dependence of the absorbance difference at a specific frequency extracted from the frequency spectrum illustrated in FIG. 11. Here, the figure indicates the irradiation time dependence of the absorbance difference at 0.6 THz. As can be seen from FIG. 12, the absorbance difference is saturated when the irradiation time is about 10 to 20 seconds. In this way, by executing terahertz wave spectroscopic measurement at regular time intervals during execution of the exposure process to acquire the absorbance difference, it is possible to estimate a degree of progress of the exposure process. In addition, it is possible to perform a control operation to monitor the absorbance difference at regular time intervals during execution of the exposure process and suspend the exposure process when a necessary and sufficient absorbance difference is obtained.

Application examples of the characteristic analysis apparatus 100 according to the present embodiment will be described below. The application examples shown below are configured based on the above-mentioned first to fifth example.

<First Application Example of Characteristic Analysis Apparatus 100>

Figure 13:
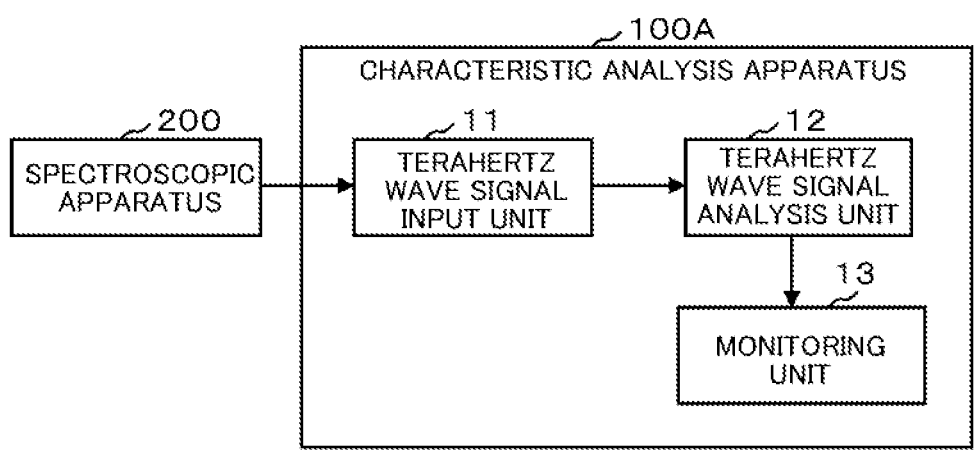
FIG. 13 is a block diagram illustrating a functional configuration example of a characteristic analysis apparatus according to a first application example of the present embodiment.

FIG. 13 is a block diagram illustrating a functional configuration example of a characteristic analysis apparatus 100A according to a first application example of the present embodiment. Note that, in FIG. 13, those having the same reference symbols as those illustrated in FIG. 1 have the same functions, and therefore, duplicate description will be omitted here.

As illustrated in FIG. 13, the characteristic analysis apparatus 100A according to the first application example is functionally configured to further include a monitoring unit 13. Based on characteristic information acquired for the photoresist during execution of processing of at least one process by the terahertz-wave signal analysis unit 12, the monitoring unit 13 monitors a state change of the photoresist during execution of the processing, and executes a predetermined process upon detecting that the characteristic information satisfies a predetermined condition and the photoresist is in a predetermined state.

For example, the monitoring unit 13 holds a value of the correlation characteristic illustrated in FIG. 6(a), performs terahertz wave spectroscopic measurement on the photoresist stored in the container at regular time intervals, and sequentially acquires the absorbance at a specific frequency, thereby monitoring a state change of the water addition concentration. Then, when the absorbance at the specific frequency reaches a predetermined value (any value on the correlation characteristic illustrated in FIG. 6(a)), a predetermined process is executed. The predetermined process is, for example, a warning notification process. Further, when it is detected that the absorbance at the specific frequency exceeds 0.163, it is possible to notify that a defect due to water addition may have occurred in the photoresist.

Further, the monitoring unit 13 may hold a value of the correlation characteristic illustrated in FIG. 6(b), perform terahertz wave spectroscopic measurement on the photoresist stored in the container at regular time intervals, and sequentially acquire the absorbance difference at a specific frequency, thereby monitoring a state change (mass reduction amount) of the mass of the photoresist. Then, when the absorbance difference at the specific frequency reaches a predetermined value (any value on the correlation characteristic illustrated in FIG. 6(b)), a predetermined process is executed. The predetermined process is, for example, a warning notification process. Further, when it is detected that the absorbance difference at the specific frequency exceeds 0.0025, it is possible to notify that a defect due to solvent evaporation may have occurred in the photoresist.

Further, the monitoring unit 13 may hold, for example, a value of the frequency spectrum when the agitation time illustrated in FIG. 7(b) is long, and perform terahertz wave spectroscopic measurement on the photoresist stored in the container at regular time intervals to sequentially acquire a frequency spectrum related to the standard deviation of the transmittance, thereby monitoring a change in homogenized state of the photoresist. Then, a difference between a measured frequency spectrum and a held frequency spectrum is calculated, and when the difference value becomes a predetermined value or more, a predetermined process is executed. The predetermined process is, for example, a warning notification process. Alternatively, an automatic agitation apparatus may be set in the container of the photoresist, and a command issuance process for instructing the automatic agitation apparatus to execute an automatic agitation process may be performed.

In addition, by performing terahertz wave spectroscopic measurement on photoresists collected from different locations in the container at regular time intervals, and sequentially acquiring a frequency spectrum related to the ratio of the transmittance illustrated in FIG. 8, the change in the homogenized state of the photoresist may be monitored. Then, a difference between a measured frequency spectrum and a flat frequency spectrum having a transmittance of 1 over the entire frequency range is calculated, and when the difference value becomes a predetermined value or more, a predetermined process is executed. The predetermined process is, for example, a warning notification process. Alternatively, an automatic agitation apparatus may be set in the container of the photoresist, and a command issuance process for instructing the automatic agitation apparatus to execute an automatic agitation process may be performed.

Further, the monitoring unit 13 may hold a value of the correlation characteristic illustrated in FIG. 6(b), perform terahertz wave spectroscopic measurement on the photoresist during execution of the baking process at regular time intervals, and sequentially acquire the absorbance difference at a specific frequency, thereby monitoring a state change (mass reduction amount) of the mass of the photoresist. Then, when the absorbance difference at the specific frequency reaches a predetermined value, a predetermined process is executed. The predetermined process is, for example, a notification process for prompting suspension of the baking process. Alternatively, a command issuance process for instructing a baking apparatus (not illustrated) to suspend the baking process may be performed.

Further, the monitoring unit 13 may hold a value of a frequency spectrum of a predetermined baking time among frequency spectra measured for each baking time as illustrated in FIG. 9, perform terahertz wave spectroscopic measurement on the photoresist during execution of the baking process at regular time intervals, and sequentially acquire the frequency spectrum of the absorbance difference, thereby monitoring the state change of the photoresist due to baking. Then, a difference between the measured frequency spectrum of the absorbance difference and the held frequency spectrum of the predetermined baking time is calculated, and when the difference value reaches a predetermined value, a predetermined process is executed. The predetermined process is, for example, a notification process for prompting suspension of the baking process. Alternatively, a command issuance process for instructing the baking apparatus (not illustrated) to suspend the baking process may be performed.

In addition, the monitoring unit 13 may perform terahertz wave spectroscopic measurement on the photoresist during execution of the baking process at regular time intervals, and sequentially acquire the absorbance difference with respect to the absorbance when the baking time is 1 minute, thereby monitoring the state change of the photoresist due to baking. Then, when the acquired absorbance difference becomes the absorbance difference corresponding to the predetermined baking time in the time domain correlation characteristic at 2.4 THz illustrated in FIG. 10, a predetermined process is executed. The predetermined process is, for example, a notification process for prompting suspension of the baking process. Alternatively, a command issuance process for instructing the baking apparatus (not illustrated) to suspend the baking process may be performed.

In addition, the monitoring unit 13 may perform terahertz wave spectroscopic measurement on the photoresist during execution of the exposure process at regular time intervals, and sequentially acquire the absorbance difference with respect to the absorbance when the exposure time is 0 seconds, thereby monitoring the state change of the photoresist due to exposure. Then, when the acquired absorbance difference becomes the absorbance difference saturated in the time domain correlation characteristic illustrated in FIG. 12, a predetermined process is executed. The predetermined process is, for example, a notification process for prompting suspension of the exposure process. Alternatively, a command issuance process for instructing an exposure apparatus (not illustrated) to suspend the exposure process may be performed.

Note that, here, a description has been given of monitoring of the manufacturing process, the storage process, the baking process, and the exposure process of the photoresist illustrated in FIG. 2. Similarly, for the application process and the development process, predetermined characteristic information may be acquired by performing terahertz wave spectroscopic measurement on the photoresist during execution of processing, and a predetermined process may be executed upon detecting that the acquired characteristic information satisfies a predetermined condition.

<Second Application Example of Characteristic Analysis Apparatus 100>

Figure 14:
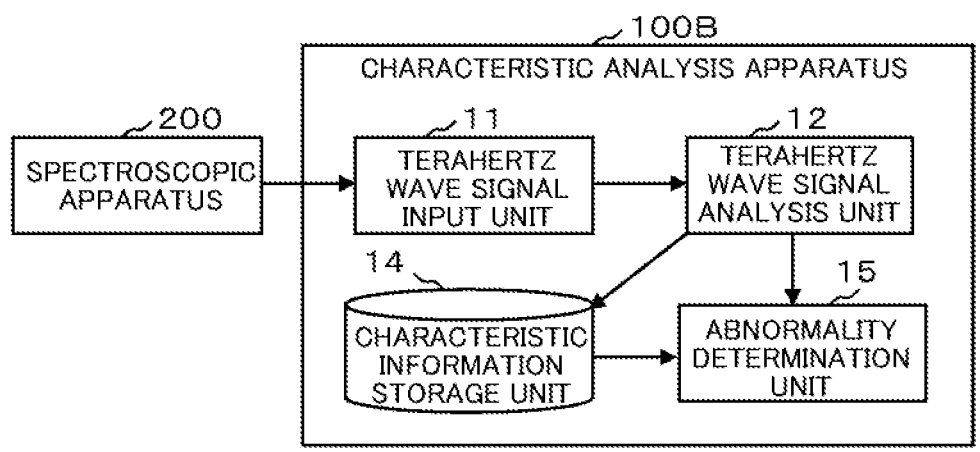
FIG. 14 is a block diagram illustrating a functional configuration example of a characteristic analysis apparatus according to a second application example of the present embodiment.

FIG. 14 is a block diagram illustrating a functional configuration example of a characteristic analysis apparatus 100B according to a second application example of the present embodiment. Note that, in FIG. 14, those having the same reference symbols as those illustrated in FIG. 1 have the same functions, and therefore, duplicate description will be omitted here.

As illustrated in FIG. 14, the characteristic analysis apparatus 100B according to the second application example is functionally configured to further include a characteristic information storage unit 14 and an abnormality determination unit 15. The characteristic information storage unit 14 stores characteristic information acquired by the terahertz-wave signal analysis unit 12 for the photoresist during or after execution of processing of at least one process. Here, the characteristic information storage unit 14 stores characteristic information acquired for the photoresist proved to have no abnormality.

The abnormality determination unit 15 compares characteristic information acquired this time by the terahertz-wave signal analysis unit 12 with past characteristic information (characteristic information acquired for the photoresist having no abnormality) stored in the characteristic information storage unit 14 to determine abnormality of the photoresist. For example, a difference between the characteristic information acquired this time by the terahertz-wave signal analysis unit 12 and the past characteristic information stored in the characteristic information storage unit 14 is calculated, and when the difference value is equal to or greater than a predetermined value, it is determined that there is a possibility that an abnormality has occurred in the photoresist.

For example, the characteristic information illustrated in FIGS. 6 to 12 acquired for the photoresist having no abnormality may be stored in the characteristic information storage unit 14 and compared with the characteristic information acquired this time by the terahertz-wave signal analysis unit 12, thereby determining the abnormality of the photoresist according to a degree of the magnitude of the difference. Note that, the characteristic information of the photoresist used for the abnormality determination is not limited to that illustrated in FIGS. 6 to 12.

Using the characteristic analysis apparatus 100B according to the second application example configured as described above, the characteristic information acquired by the terahertz wave spectroscopic measurement in each process may be stored, and when there is some trouble with the photoresist, it is possible to easily find the cause of trouble and create a countermeasure plan by retroactively determining the abnormality using the characteristic information acquired in each process. In addition, by executing terahertz wave spectroscopic measurement during or after execution of processing of each process to perform abnormality determination, it is possible to verify in real time whether the processing of each process is properly performed and to issue an alert when an abnormality is detected.

Note that, the above-mentioned abnormality determination for the photoresist may be performed in any of the manufacturing process, the storage process, the application process, the baking process, the exposure process, and the development process of the photoresist illustrated in FIG. 2.

<Third Application Example of Characteristic Analysis Apparatus 100>

Figure 15:
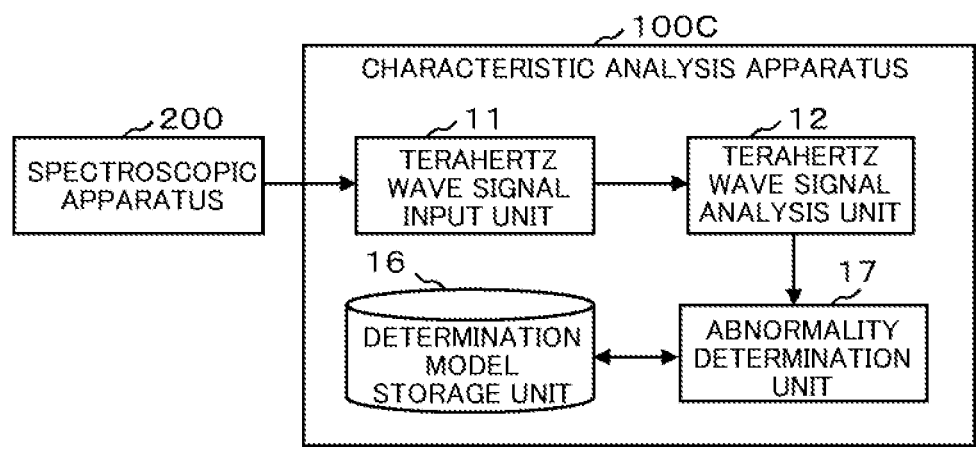
FIG. 15 is a block diagram illustrating a functional configuration example of a characteristic analysis apparatus according to a third application example of the present embodiment.

FIG. 15 is a block diagram illustrating a functional configuration example of a characteristic analysis apparatus 100C according to a third application example of the present embodiment. Note that, in FIG. 15, those having the same reference symbols as those illustrated in FIG. 1 have the same functions, and therefore, duplicate description will be omitted here.

As illustrated in FIG. 15, the characteristic analysis apparatus 100C according to the third application example is functionally configured to include a determination model storage unit 16 and an abnormality determination unit 17. The determination model storage unit 16 stores a determination model subjected to machine learning to determine an abnormality of the photoresist. The determination model stored in the determination model storage unit 16 is subjected to machine learning using teacher data so that when the characteristic information of the photoresist is input, a value related to the presence or absence of an abnormality of the photoresist is output.

The teacher data used for this machine learning is data created by assigning an identification label of "there is abnormality/there is no abnormality" to each of the characteristic information acquired when there is no abnormality of the photoresist and the characteristic information acquired when there is an abnormality of the photoresist for a plurality of pieces of characteristic information acquired for a plurality of photoresists. The characteristic information of the photoresist used as the teacher data may be the characteristic information illustrated in FIGS. 6 to 12, or may be other characteristic information.

The form of the determination model may be any one of a regression model such as linear regression, logistic regression, or support vector machine, a tree model such as decision tree, regression tree, or random forest, perceptron, a neural network model such as convolutional neural network, a Bayesian model based on Bayesian inference, etc., k-nearest neighbor method, or a clustering model such as hierarchical/non-hierarchical clustering. Note that, the form of the determination model given here is only an example, and the invention is not limited thereto.

The abnormality determination unit 17 determines whether or not there is an abnormality of the photoresist by inputting the characteristic information acquired by the terahertz-wave signal analysis unit 12 to the determination model in the determination model storage unit 16. As the amount of characteristic information used as teacher data increases, the accuracy of abnormality determination by the abnormality determination unit 17 using the determination model improves. In this way, it is possible to detect abnormality of the photoresist at an earlier stage and prevent the occurrence of trouble.

Note that, the above-mentioned abnormality determination for the photoresist may be performed in any of the manufacturing process, the storage process, the application process, the baking process, the exposure process, and the development process of the photoresist illustrated in FIG. 2.

As described in detail above, according to the present embodiment, by spectroscopically measuring a photoresist with a terahertz wave, it is possible to acquire characteristic information of the photoresist in a process without changing the characteristics of the photoresist by the action of a measuring means, and to appropriately evaluate the characteristics of the photoresist from the characteristic information. In addition, terahertz wave spectroscopic measurement may be performed with the photoresist applied to the silicon wafer, and the characteristics of the photoresist formed on the silicon wafer may be confirmed in a non-contact and non-destructive manner.

In this way, in a plurality of processes from the manufacturing process to the development process of the photoresist, it is possible to monitor the characteristics of the photoresist in each process or determine the abnormality of the photoresist from the characteristics. At this time, it is possible to consistently measure the characteristics of the photoresist in each of the liquid state, the solid state, and the chemical reaction progress state using the same measurement technology, and investigate the cause of the defect.

Note that, in the above embodiment, a description has been given of an example of performing terahertz wave spectroscopic measurement on the photoresist used in the manufacturing process of the semiconductor device. However, the invention is not limited thereto. For example, it is possible to perform terahertz wave spectroscopic measurement on a photoresist used in a manufacturing process of MEMS, a liquid crystal display, or other various products.

In addition, the above embodiment is merely an example of the embodiment in carrying out the invention, and the technical scope of the invention should not be construed in a limited manner. That is, the invention may be implemented in various ways without departing from the gist or main features thereof.

REFERENCE SIGNS LIST

11 Terahertz-wave signal input unit
12 Terahertz-wave signal analysis unit
13 Monitoring unit
14 Characteristic information storage unit
15 Abnormality determination unit
16 Determination model storage unit
17 Abnormality determination unit
100, 100A to 100C Characteristic analysis apparatus
200 Spectroscopic apparatus

The invention claimed is:

1. A photoresist characteristic analysis method wherein spectroscopic processing using a terahertz wave is performed on a photoresist to acquire a correlation characteristic indicating a relationship between a plurality of elements including a characteristic value of the photoresist as characteristic information of the photoresist, the correlation characteristic being a frequency domain correlation characteristic indicating a relationship between a frequency and the characteristic value, the photoresist characteristic analysis method comprising:

a first step of acquiring a frequency spectrum indicating a relationship between a frequency and the characteristic value;
a second step of specifying a single frequency according to a predetermined criterion based on the frequency spectrum acquired in the first step; and
a third step of acquiring the characteristic value at a frequency specified in the second step, wherein the frequency domain correlation characteristic indicating a relationship between a frequency specified in the second step and a characteristic value acquired in the third step is acquired as the correlation characteristic.

2. A photoresist characteristic analysis method wherein spectroscopic processing using a terahertz wave is performed on a photoresist to acquire a correlation characteristic indicating a relationship between a plurality of elements including a characteristic value of the photoresist as characteristic information of the photoresist, the correlation characteristic being at least one of a time domain correlation characteristic indicating a relationship between a processing time for the photoresist and the characteristic value, and an inter-characteristic value correlation characteristic indicating a relationship between a first characteristic value and a second characteristic value of the photoresist, the photoresist characteristic analysis method comprising:

a first step of acquiring a frequency spectrum indicating a relationship between a frequency and the characteristic value;
a second step of specifying a single frequency according to a predetermined criterion based on the frequency spectrum acquired in the first step; and
a third step of acquiring the correlation characteristic using the characteristic value detected at a frequency specified in the second step.

3. A photoresist characteristic analysis method wherein spectroscopic processing using a terahertz wave is performed on a photoresist to acquire a correlation characteristic indicating a relationship between a plurality of elements including a characteristic value of the photoresist as characteristic information of the photoresist, the correlation characteristic being at least one of a time domain correlation characteristic indicating a relationship between a processing time for the photoresist and the characteristic value, and an inter-characteristic value correlation characteristic indicating a relationship between a first characteristic value and a second characteristic value of the photoresist, wherein spectroscopic processing using the terahertz wave is performed on a photoresist during or after execution of processing of at least one process among a plurality of processes from a manufacturing process of the photoresist to a development process of a wafer to which the photoresist is applied.

4. The photoresist characteristic analysis method according to claim 3, wherein spectroscopic processing using the terahertz wave is performed on the photoresist in a liquid state in a process before application to the wafer among the plurality of processes.

5. The photoresist characteristic analysis method according to claim 3, wherein spectroscopic processing using the terahertz wave is performed on the photoresist in a state of being applied to a surface of the wafer in a thin film shape in an application process among the plurality of processes.

6. The photoresist characteristic analysis method according to claim 3, wherein spectroscopic processing using the terahertz wave is performed on the photoresist in a state of being baked in a baking process among the plurality of processes.

7. The photoresist characteristic analysis method according to claim 3, wherein spectroscopic processing using the terahertz wave is performed on the photoresist in a state of being exposed in an exposure process among the plurality of processes.

8. The photoresist characteristic analysis method according to claim 3, wherein spectroscopic processing using the terahertz wave is performed on the photoresist in a state of being developed in a development process among the plurality of processes.

\* \* \* \* \*